United States Patent
Yang

[11] Patent Number: 6,159,810
[45] Date of Patent: Dec. 12, 2000

[54] METHODS OF FABRICATING GATES FOR INTEGRATED CIRCUIT FIELD EFFECT TRANSISTORS INCLUDING AMORPHOUS IMPURITY LAYERS

[75] Inventor: Jeong-hwan Yang, Kyungki-do, Rep. of Korea

[73] Assignee: Samsung Electronics Co., Ltd., Rep. of Korea

[21] Appl. No.: 09/400,163

[22] Filed: Sep. 21, 1999

[30] Foreign Application Priority Data

Feb. 5, 1999 [KR] Rep. of Korea .......................... 99-3958

[51] Int. Cl.$^7$ ................................................. H01L 21/336

[52] U.S. Cl. .......................... 438/301; 438/530; 438/532; 438/592; 438/593; 438/653; 438/657

[58] Field of Search ...................................... 438/301, 532, 438/530, 652, 657, 653, 666, 592, 593

[56] References Cited

U.S. PATENT DOCUMENTS

| | | | |
|---|---|---|---|
| 4,479,831 | 10/1984 | Sandow et al. | 148/1.5 |
| 5,563,093 | 10/1996 | Koda et al. | 437/101 |
| 5,614,428 | 3/1997 | Kapoor | 437/41 |
| 5,648,675 | 7/1997 | Terada et al. | 257/458 |
| 5,837,598 | 11/1998 | Aronowitz et al. | 438/532 |

OTHER PUBLICATIONS

Wolf et al., Silicon Processing for the VLSI Era, vol. 1: *Process Technology*, Lattice Press, 1986, p. 8.

*Primary Examiner*—Long Pham
*Attorney, Agent, or Firm*—Myers Bigel Sibley & Sajovec

[57] ABSTRACT

Gate electrodes for integrated circuit field effect transistors are fabricated by forming a polysilicon layer on a gate insulating layer opposite an integrated circuit substrate, forming an amorphous impurity layer on the polysilicon layer opposite the gate insulating layer, and forming an amorphous silicon layer on the amorphous impurity layer opposite the polysilicon layer. The amorphous silicon layer, the amorphous impurity layer and the polysilicon layer are patterned to define a gate electrode pattern. The polysilicon layer, the amorphous impurity layer and the amorphous silicon layer then are converted into a polysilicon gate having a first surface adjacent the gate insulating layer, a second surface opposite the gate insulating layer, and a buried doped layer within the polysilicon gate electrode that is spaced apart from the first and second surfaces thereof. The converting preferably takes place by thermally treating the gate electrode pattern. By using amorphous silicon for the outer portion of the gate insulating layer, patterning can be provided effectively. Moreover, since polysilicon is initially provided adjacent the gate insulating layer, stresses, cracking and/or defects may be reduced when thermally treating the gate electrode pattern to form the polysilicon gate.

17 Claims, 6 Drawing Sheets

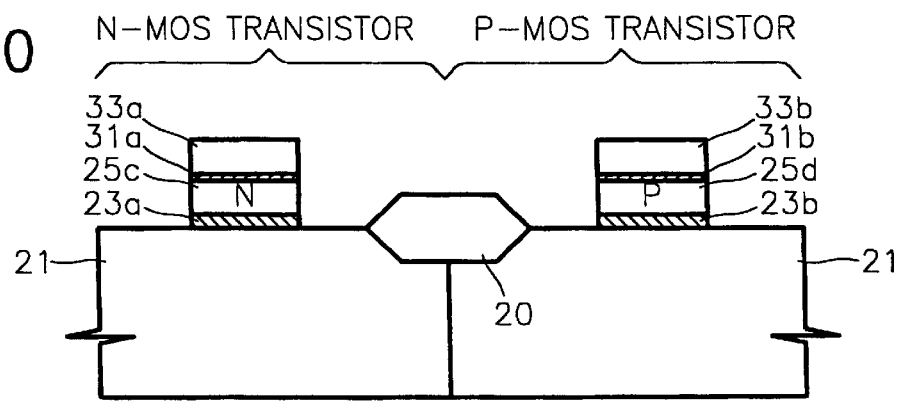
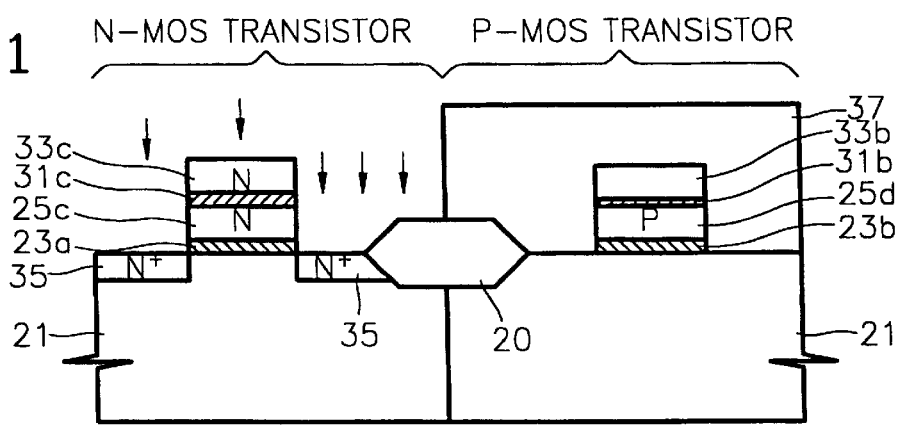
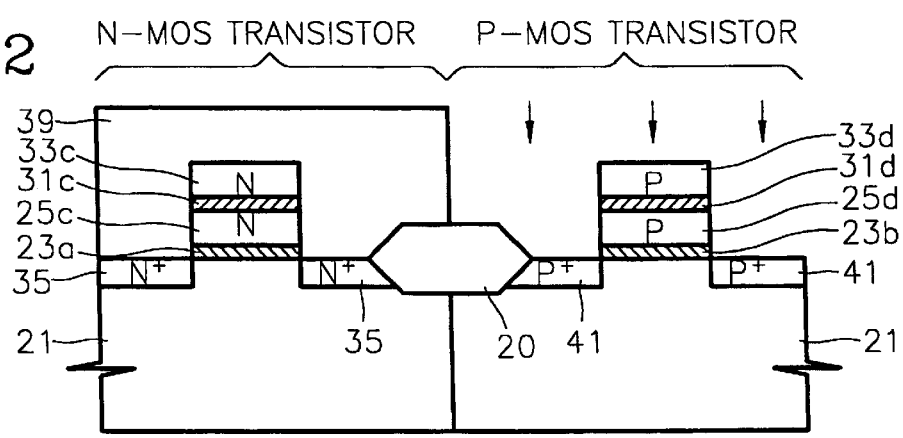

METHODS OF FABRICATING GATES FOR INTEGRATED CIRCUIT FIELD EFFECT TRANSISTORS INCLUDING AMORPHOUS IMPURITY LAYERS

FIELD OF THE INVENTION

This invention relates to microelectronic devices and fabrication methods therefor, and more particularly to integrated circuit field effect transistors and fabrication methods therefor.

BACKGROUND OF THE INVENTION

Integrated circuit field effect transistors are widely used in microelectronic devices such as logic, memory and/or microprocessor devices. As is well known to those having skill in the art, an integrated circuit field effect transistor includes spaced apart source and drain regions in an integrated circuit substrate, such as a silicon semiconductor substrate, and an insulated gate on the integrated circuit substrate between the spaced apart source and drain regions. The insulated gate includes an insulating layer on the integrated circuit substrate and a gate electrode on the insulating layer opposite the integrated circuit substrate. The source and drain regions may be formed by implanting dopants into the substrate, thereby defining a channel region therebetween, beneath the gate electrode. Insulated gate field effect transistors also are referred to as MOS transistors or MOSFETs.

The gate electrode of an integrated circuit field effect transistor generally comprises doped polysilicon that may be doped, for example, with an n-type impurity, such as phosphorus or arsenic. Unfortunately, since polysilicon may have a rough surface morphology, it may be difficult to pattern a polysilicon layer to provide a polysilicon gate electrode.

Accordingly, it has been proposed to form a gate electrode using amorphous silicon that can have a smoother surface morphology than that of polysilicon. For example, as shown in FIG. 1, a gate insulating layer 53, such as silicon dioxide is formed on an integrated circuit substrate 51, such as a monocrystalline silicon substrate. An amorphous silicon layer 55 then is formed on the gate insulating layer 53 opposite the substrate 51. Also see U.S. Pat. No. 4,479,831 to Sandow et al. entitled Method of Making Low Resistance Polysilicon Gate Transistors and Low Resistance Interconnections Therefore Via Gas Deposited In-Situ Doped Amorphous Layer and Heat-Treatment and U.S. Pat. No. 5,563,093 to Koda et al. entitled Method of Manufacturing FET Semiconductor Devices With Polysilicon Gate Having Large Grain Sizes.

After forming and patterning the amorphous silicon layer 55, a thermal treatment generally is performed to convert the amorphous silicon gate 55 into polysilicon. Unfortunately, during the thermal treatment, stresses 57 may be formed in the polysilicon gate, which may lead to defects 59 in the gate insulating layer 53. These defects may cause the leakage current of the field effect transistor to unduly increase, and can lead to failure of the integrated circuit field effect transistor.

Attempts have been made to overcome the introduction of defects into the gate electrode. For example, see U.S. Pat. No. 5,614,428 to Kapoor entitled Process and Structure for Reduction of Channeling During Implantation of Source and Drain Region in Formation of MOS Integrated Circuit Structures, and U.S. Pat. No. 5,837,598 to Aronowitz et al. entitled Diffusion Barrier for Polysilicon Gate Electrode of MOS Device in Integrated Circuit Structure, and Method of Making Same.

Notwithstanding these and other attempts, it still is desirable to provide improved methods of forming gates for integrated circuit field effect transistors and integrated circuit field effect transistors so formed.

SUMMARY OF THE INVENTION

It therefore is an object of the present invention to provide improved methods of fabricating gates of integrated circuit field effect transistors, and integrated circuit field effect transistors so fabricated.

It is another object of the present invention to provide integrated circuit field effect transistor gates that can be patterned effectively, and fabrication methods therefor.

It is yet another object of the present invention to provide gates and gate fabrication methods for integrated circuit field effect transistors that can reduce defects in an underlying gate insulating layer during fabrication of the field effect transistor.

These and other objects may be provided, according to the present invention, by forming a polysilicon layer on a gate insulating layer opposite an integrated circuit substrate, forming an amorphous impurity layer on the polysilicon layer opposite the gate insulating layer, and forming an amorphous silicon layer on the amorphous impurity layer opposite the polysilicon layer. The amorphous silicon layer, the amorphous impurity layer and the polysilicon layer are patterned to define a gate electrode pattern. The polysilicon layer, the amorphous impurity layer and the amorphous silicon layer then are converted into a polysilicon gate having a first surface adjacent the gate insulating layer, a second surface opposite the gate insulating layer, and a buried doped layer within the polysilicon gate electrode that is spaced apart from the first and second surfaces thereof. The converting preferably takes place by thermally treating the gate electrode pattern. By using amorphous silicon for the outer portion of the gate insulating layer, patterning can be provided effectively. Moreover, since polysilicon initially is provided adjacent the gate insulating layer, stresses, cracking and/or defects may be reduced when thermally treating the gate electrode pattern to form the polysilicon gate.

The amorphous impurity layer may be formed by plasma processing the polysilicon layer opposite the gate insulating layer to amorphize the surface of the polysilicon layer opposite the gate insulating layer. Plasma processing may be performed using at least one of argon, xenon, helium and krypton. Alternatively, the amorphous impurity layer may be formed by implanting ions into the polysilicon layer opposite the gate insulating layer, to amorphize the surface of the polysilicon layer opposite the gate insulating layer. Implantation of silicon, germanium, indium, arsenic and/or antimony may be used.

The buried doped layer within the polysilicon gate electrode, that is spaced apart from the first and second surfaces thereof, preferably is formed from the amorphous impurity layer. During thermal treatment, diffusion of dopants generally takes place. Accordingly, the buried doped layer may be characterized by a dopant or impurity profile within the polysilicon gate electrode. For example, the polysilicon gate electrode has a doping concentration of at least one dopant that decreases from the buried doped layer towards the first surface and towards the second surface. Alternatively, the buried doped layer has doping concentration of at least one dopant that is higher than the doping concentration of the at least one dopant at the first and second surfaces of the polysilicon gate electrode. It will be understood that other dopants may be present in the polysilicon gate electrode that have uniform doping concentration in the polysilicon gate electrode. Alternatively, or in addition, other dopants may have nonuniform doping concentrations within the polysilicon gate electrode.

Intermediate product integrated circuit field effect transistors according to the present invention include spaced apart source and drain regions in an integrated circuit substrate and an insulated gate on the integrated circuit substrate between the spaced apart source and drain regions. The insulated gate preferably comprises a polysilicon layer on the gate insulating layer opposite the integrated circuit substrate, an amorphous impurity layer on the polysilicon layer opposite the gate insulating layer and an amorphous silicon layer on the amorphous impurity layer opposite the polysilicon layer. The amorphous impurity layer preferably comprises at least one of argon, xenon, helium, krypton, silicon, germanium, indium, arsenic and/or antimony.

Final product integrated circuit field effect transistors according to the present invention preferably include spaced apart source and drain regions in an integrated circuit substrate and an insulated gate on the integrated circuit substrate between the spaced apart source and drain regions. The insulated gate preferably comprises an insulating layer on the integrated circuit substrate and a polysilicon gate electrode having a first surface adjacent the gate insulating layer, a second surface opposite the gate insulating layer and a doping concentration of at least one dopant within the polysilicon gate electrode that decreases from within the polysilicon gate electrode towards the first surface and towards the second surface. Alternatively, the doping concentration of at least one dopant within the polysilicon gate electrode is higher within the polysilicon gate electrode than at the first and second surfaces of the polysilicon gate electrode. As described above, doping concentrations of other dopants may be uniform or nonuniform within the polysilicon gate electrode. Accordingly, integrated circuit field effect transistors can be formed that can have high performance and/or high reliability. It also will be understood that the present invention may be used to form other conductors for integrated circuits, such as conductive wiring layers, bit lines and the like.

BRIEF DESCRIPTION OF THE DRAWINGS

FIGS. 6–12 are cross-sectional views of integrated circuit field effect transistors according to the present invention during intermediate fabrication steps.

DETAILED DESCRIPTION OF PREFERRED EMBODIMENTS

Figure 1:
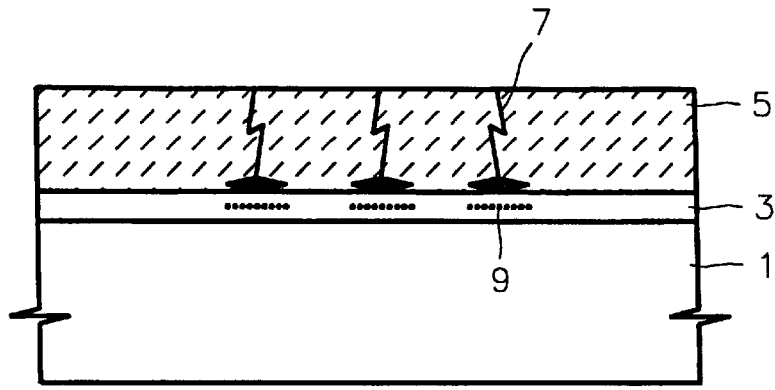
FIG. 1 is a cross-sectional view of a conventional integrated circuit field effect transistor gate electrode.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Figure 2:
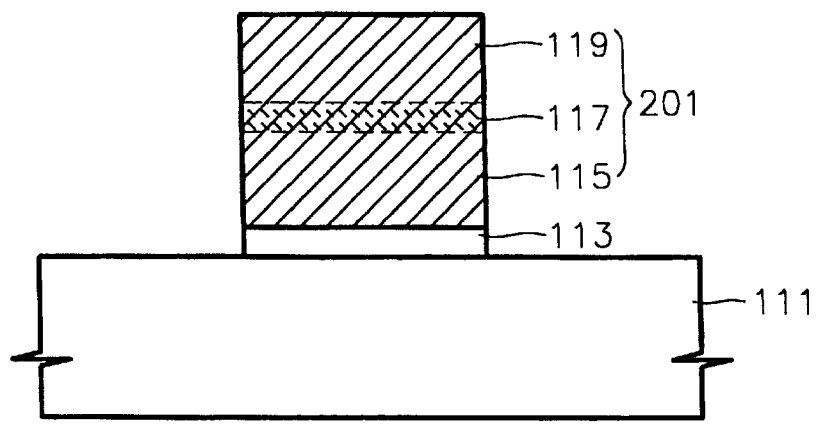
FIG. 2 is a cross-sectional view of an integrated circuit field effect transistor gate electrode according to the present invention.

Referring now to FIG. 2, a cross-sectional view of integrated circuit field effect transistor insulated gates according to the present invention is shown. As shown in FIG. 2, the insulated gate is on an integrated circuit substrate 111, such as a monocrystalline silicon substrate, and includes an insulating layer 113 on the integrated circuit substrate 111 and a polysilicon gate electrode 201 having a first (lower) surface 201a adjacent the gate insulating layer 113 and a second (upper or outer) surface 201b opposite (remote from) the gate insulating layer 113.

More specifically, as shown in FIG. 2, the polysilicon gate electrode 201 includes a polysilicon layer 115 on the gate insulating layer 113 opposite the integrated circuit substrate 111, an amorphous impurity layer 117 on the polysilicon layer 115 opposite the gate insulating layer 113 and an amorphous silicon layer 119 on the amorphous impurity layer 117 opposite the polysilicon layer 115. It will be understood that the polysilicon layer 115 and the amorphous silicon layer 119 may be uniformly or nonuniformly doped n-type or p-type. In particular, for an NMOS transistor, a p-type polysilicon gate doping may be used, and for a PMOS transistor, an n-type polysilicon gate doping may be used.

Although the amorphous impurity layer 117 is shown at the center of the gate electrode 201, it may be located at other positions within the polysilicon gate electrode, as long as it is between the polysilicon layer 115 and the amorphous layer 119. Stated differently, the absolute and relative thicknesses of the polysilicon layer 115, the amorphous impurity layer 117 and the amorphous silicon layer 119 may vary.

The amorphous impurity layer 117 may be doped with an inert element, such as argon (Ar), xenon (Xe), helium (He) and/or krypton (Kr). Alternatively, the amorphous impurity layer 117 may comprise silicon (Si), germanium (Ge) or indium (In) in a p-type gate electrode, or arsenic (As) or antimony (Sb) in an n-type gate electrode. As shown in FIG. 2, the amorphous impurity layer 117 that is formed on the polysilicon layer 115 allows the amorphous silicon layer 119 to be formed thereon without substantial crystallization. Moreover, since the amorphous silicon layer 119 may have a smooth morphology, it may be patterned readily and uniformly to form a gate electrode. Finally, the polysilicon layer 115 can reduce and preferably prevent cracking and defects in the underlying gate insulating layer 113 during subsequent processing.

During subsequent processing, as will be described in detail below, the polysilicon layer 115, the amorphous impurity layer 117 and the amorphous silicon layer 119 are converted into a polysilicon gate 201 having a buried doped layer corresponding to the amorphous impurity layer 117, within the polysilicon gate electrode, that is spaced apart from the first and second surfaces 201a and 201b thereof. In particular, during subsequent processing, diffusion of the impurities in the amorphous impurity layer 119 takes place and the amorphous silicon layer 119 is converted to polycrystalline silicon. The impurity profile of the impurities in the impurity layer preferably remains so that the doping concentration of at least one dopant within the polysilicon gate electrode 201 is higher within the polysilicon gate electrode than at the first and second surfaces 201a and 201b of the polysilicon gate electrode. Stated differently, the doping concentration preferably peaks within the polysilicon gate electrode. Stated another way, the doping concentration of at least one dopant within the polysilicon gate electrode decreases from within the polysilicon gate electrode towards the first surface 201a and towards the second surface 201b.

Figure 3:
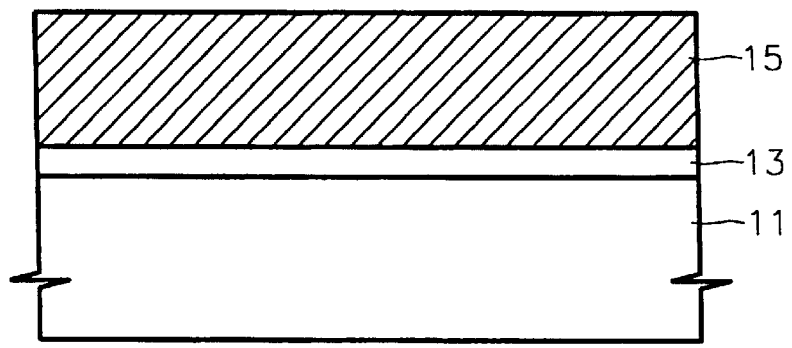
FIGS. 3–5 are cross-sectional views illustrating fabrication of integrated circuit field effect transistor gate electrodes of FIG. 2 during intermediate fabrication steps.
Figure 4:
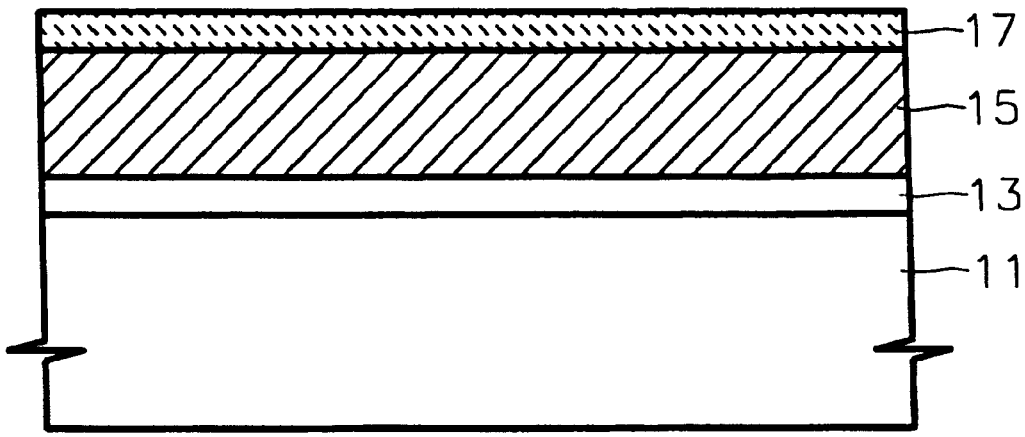
Figure 5:
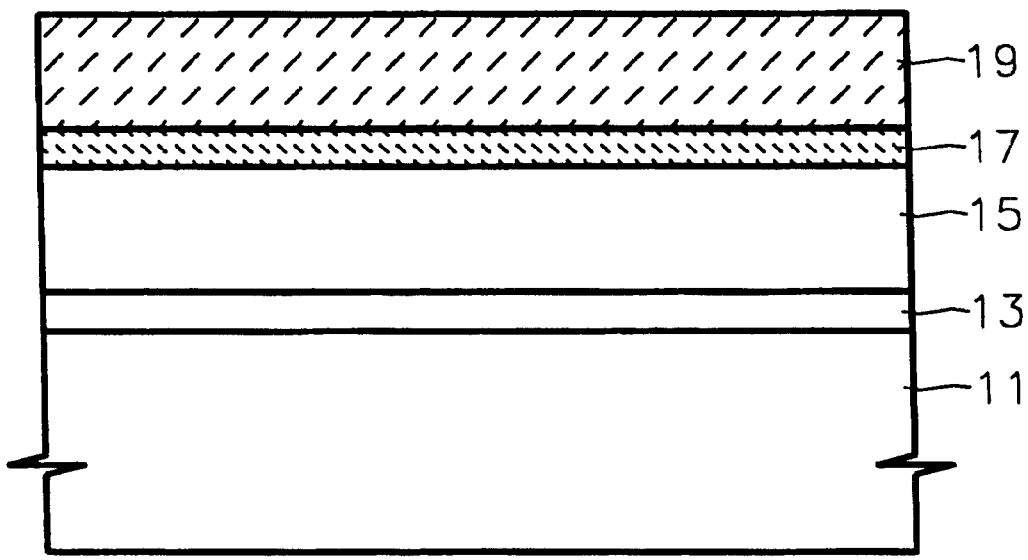

FIGS. 3–5 are cross-sectional views of integrated circuit field effect transistor gate electrodes according to the present invention during intermediate fabrication steps. As shown in FIG. 3, a gate insulating layer 13 is formed on an integrated circuit substrate 11, such as a silicon semiconductor substrate. The gate insulating layer 13 preferably comprises silicon dioxide, although other materials also may be used. Then, a polysilicon layer 15 is formed on the gate insulating layer 13. The polysilicon layer may be doped with an n-type impurity, such as arsenic or phosphorus, or a p-type impurity such as boron. The thickness of the polysilicon layer 15 preferably is between about 500 Å and about 2400 Å. In the polysilicon layer 15, the surface morphology generally is rough, so that it may be difficult to pattern the polysilicon layer 15 to form a gate electrode.

Referring now to FIG. 4, an amorphous impurity layer 17 is formed on the polysilicon layer 15. The amorphous layer 17 can allow an amorphous silicon layer to be formed thereon subsequently, as will be described below.

The amorphous impurity layer 17 may be formed using plasma processing, ion implantation and/or other techniques. To form the amorphous impurity layer 17 by plasma processing, the substrate 11 is inserted into a plasma processing chamber. A plasma, preferably of an inert element such as argon, xenon, helium or krypton, preferably penetrates into the surface of the polysilicon layer 15, to thereby form the amorphous impurity layer 17. In a second method, ions are implanted into the surface of the polysilicon layer 15 to form the amorphous impurity layer 17. The ions preferably comprise elements that have atomic weight equal to or larger than that of silicon, such as silicon, germanium, indium, arsenic or antimony.

Then, as shown in FIG. 5, an amorphous silicon layer 19 is formed on the amorphous impurity layer 17. The thickness of the amorphous silicon layer 19 may be between about 500 Å and about 2400 Å. Since the amorphous impurity layer 17 does not provide a crystallization seed, the amorphous silicon layer 19 can be formed reliably. Then, the amorphous silicon layer 19, the amorphous impurity layer 17 and the polysilicon layer 15 are patterned using conventional photolithography to form the gate electrode pattern of FIG. 2. Since the surface of the amorphous silicon layer can be smooth, patterning can be performed uniformly and reliably.

Then, referring back to FIG. 2, the amorphous impurity layer 17 and the amorphous silicon layer 19 are converted into a polysilicon gate electrode having a first surface 201a adjacent the gate insulating layer 113, a second surface 201b opposite the gate insulating layer and a buried doped layer within the polysilicon gate electrode that is spaced apart from the first and second surfaces thereof. During this conversion, dopants in the amorphous impurity layer 117 may diffuse upward and downward into the polysilicon gate electrode 201, to form a doping profile that peaks within the polysilicon gate electrode 201. The doping profile may decrease linearly or nonlinearly. It may have a Gaussian or non-Gaussian shape. Impurity profiles for implanted ions are described in Chapter 9 of the textbook entitled *Silicon Processing for the VLSI Era, Volume 1-Process Technology* by Wolf and Tauber, 1997, at Chapter 9 entitled *Ion Implantation for VLSI*, pp. 280–308, the disclosure of which is hereby incorporated herein by reference. After formation of the gate electrode 201, additional doping of the polysilicon gate electrodes 201 with n-type or p-type impurity to control resistivity may be performed if necessary.

Figure 6:
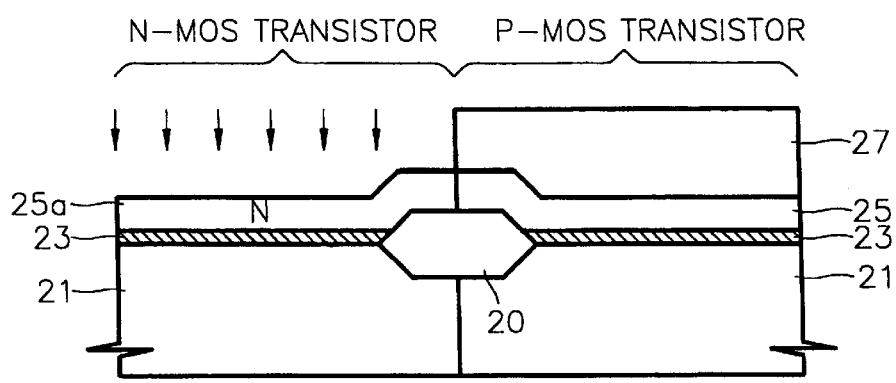

FIGS. 6–12 are cross-sectional views illustrating fabrication of field effect transistors including gate electrodes according to the present invention. In FIGS. 6–12, the left portions of the figures indicates an NMOS transistor region and the right portions thereof indicate a PMOS transistor region. Referring now to FIG. 6, a gate insulating layer 23 is formed on an integrated circuit substrate 21 including conventional field isolation regions 20. The integrated circuit substrate 21 preferably is a monocrystalline silicon substrate and the field isolation regions 20 may be formed using conventional thermal oxidation, trench isolation and/or other conventional methods. The gate insulating layer 23 preferably comprises silicon dioxide. However, other materials may be used. Then, a polysilicon layer 25 is formed on the gate insulating layer 23. The polysilicon layer 25 may have a thickness of between 500 Å and about 2400 Å. The surface of the polysilicon layer 25 is rough, so that it may be difficult to pattern using conventional photolithography. Finally, a first photoresist pattern 27 is formed on the PMOS transistor region, and an n-type impurity such as arsenic or antimony is implanted into the NMOS transistor region to form an n-type polysilicon layer 25.

Figure 7:
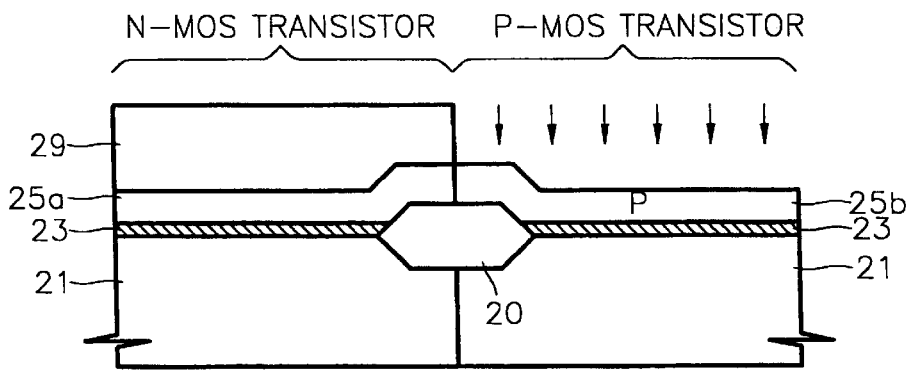

Referring now to FIG. 7, the first photoresist pattern 27 is removed, and a second photoresist pattern 29 is formed covering the NMOS transistor region. A p-type impurity such as boron is implanted into the PMOS transistor region to form a p-type polysilicon layer 25b. The second photoresist pattern 29 then may be removed.

Figure 8:
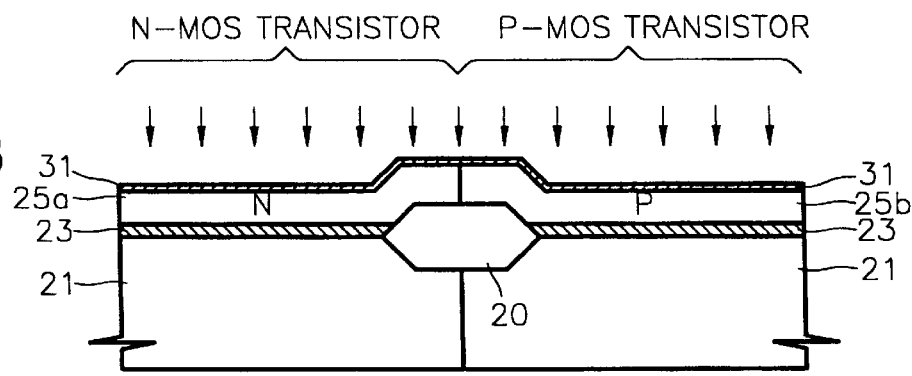

Referring now to FIG. 8, an n-type or p-type amorphous impurity layer 31 is formed on the polysilicon layer 25a and 25b. The amorphous impurity layer 31 can act as a seed layer for subsequent formation of an amorphous silicon layer, as will be described below. The amorphous impurity layer 31 may be formed by implanting a p-type impurity such as indium, or an n-type impurity such as arsenic or antimony, into the surface of the polysilicon layer 25a and 25b.

Figure 9:
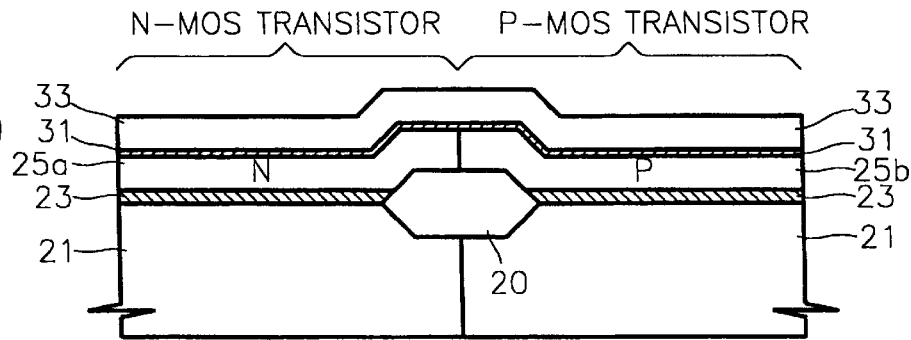

Referring now to FIG. 9, an amorphous silicon layer 33 is formed on the amorphous impurity layer 31. The amorphous silicon layer 33 may have a thickness of between about 500 Å and about 2400 Å. Since the amorphous impurity layer 31 does not provide crystallization seeds, an amorphous silicon layer 33 can be formed reliably.

Referring now to FIG. 10, the structure then is patterned to form gate electrodes for the NMOS transistor and the PMOS transistor. In detail, the amorphous silicon layer 33, the amorphous impurity layer 31, the polysilicon layer 25 and the gate insulating layer 23 are patterned using conventional photolithography. Since the amorphous silicon layer surface morphology may be flat, the patterning may be performed uniformly and reliably. The patterning produces a gate insulating layer pattern 23a, an n-type polysilicon layer pattern 25c, an n-type or a p-type amorphous impurity layer pattern 31a and an amorphous silicon layer pattern 33a in the NMOS transistor region. A gate insulating layer pattern 23b, a p-type polysilicon layer pattern 25d, an n-type or p-type amorphous impurity layer pattern 31b and an amorphous silicon layer pattern 33b are formed in the PMOS transistor region.

Referring now to FIG. 11, source and drain regions for the NMOS transistor are formed. In particular, a third photoresist pattern 37 is formed on the PMOS transistor region and an n-type impurity such as arsenic or phosphorus is implanted into the NMOS transistor region. The third photoresist pattern 37 may be removed, and a thermal treatment may be performed to form n-type source and drain regions 35. Simultaneously, the amorphous silicon layer pattern 33a is changed into an n-type polysilicon layer pattern 33c and the amorphous impurity layer 31a becomes an n-type or a p-type impurity layer 31c. As a result, a gate electrode for an NMOS transistor includes a buried doped layer 31c in a polysilicon gate electrode 25c, 33c. In other words, at least one dopant has a peak value within the polysilicon gate electrode.

Finally, referring to FIG. 12, a p-type source and drain region is formed for the PMOS transistor. In particular, the third photoresist pattern 37 is removed, and a fourth photoresist pattern 39 is formed on the NMOS transistor region. A p-type impurity such as boron is implanted into the PMOS transistor region using the gate as a mask. Then, the fourth photoresist pattern 39 is removed and the resultant structure is thermally treated to form p-type source and drain regions 41 in the integrated circuit substrate 21. Simultaneously, the amorphous silicon layer pattern 33b is converted to a p-type polysilicon layer pattern 33d, and the amorphous impurity layer 31b is converted to an n-type or a p-type buried doped layer within the polysilicon gate electrode. Accordingly, the buried doped layer 31d is included within the polysilicon gate electrode 25d, 33d. As described above, at least one dopant has a peak dopant value within the polysilicon gate electrode that is spaced apart from the first and second surfaces thereof.

Accordingly, a CMOS device including an NMOS transistor and a PMOS transistor is formed. It will be understood that separate thermal treatments may be used to form the source and drain regions and to convert the amorphous impurity layer and the amorphous silicon layer into a polysilicon gate having a buried doped layer. Alternatively, a single thermal treatment can convert the amorphous impurity layer and the amorphous silicon layer in both the NMOS transistor and PMOS transistor.

Figure 13:
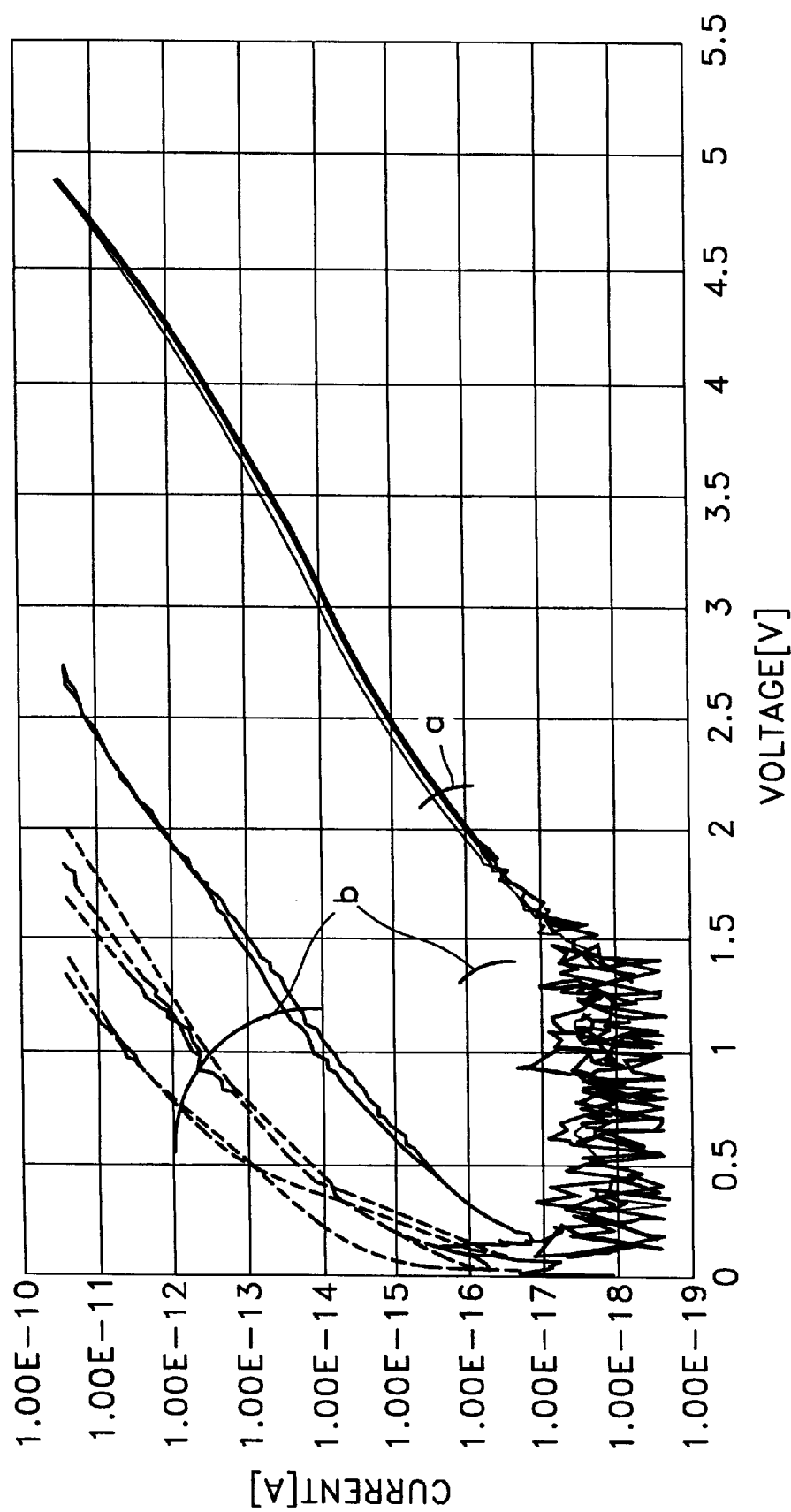
FIGS. 13 and 14 graphically illustrate leakage current of conventional integrated circuit field effect transistors and integrated circuit field effect transistors according to the present invention, respectively.
Figure 14:
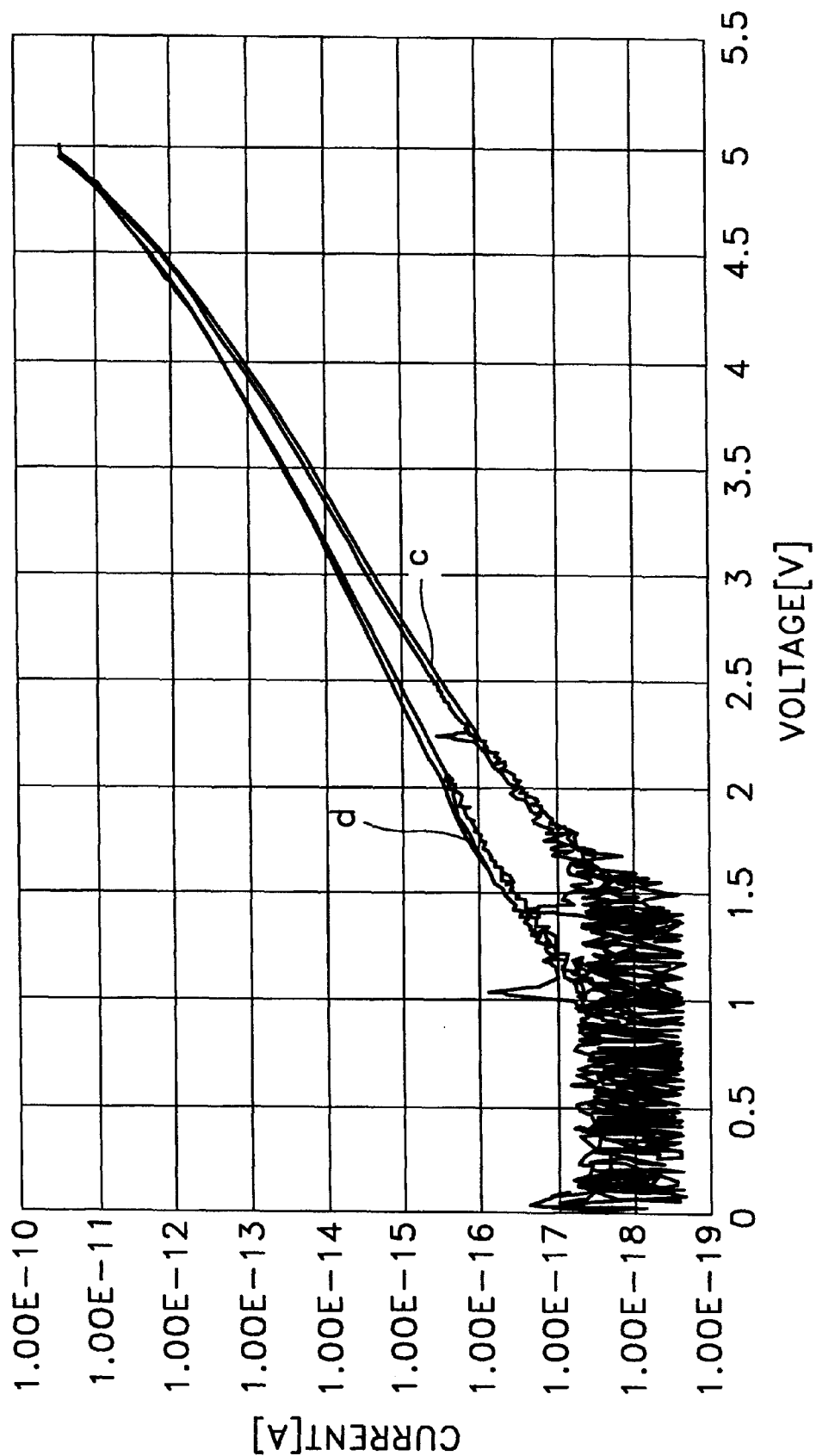

FIG. 13 graphically illustrates leakage current characteristics of a conventional MOS transistor having a gate electrode in which an amorphous silicon layer is formed and the resultant structure is thermally treated. FIG. 14 graphically illustrates leakage current characteristics of a MOS transistor according to the present invention having a gate electrode in which a polysilicon layer and an amorphous silicon layer are sequentially formed and the resultant structure is thermally treated. In FIGS. 13 and 14, the X-axis and Y-axis indicate the gate voltage and gate current per unit area ($\mu m^2$), respectively, reference characters a and c indicate leakage current of an initial state, and reference characters b and d indicate leakage current after stress of several volts, e.g., approximately 6V, is applied to the gate electrodes.

As shown in FIG. 13, in a conventional MOS transistor, the gate insulating layer may be severely damaged. Thus, the leakage current that is generated after stress and scattering may be very severe. However, as shown in FIG. 14, in a MOS transistor according to the present invention, the gate insulating layer has little or no damage. Thus, an increase in the leakage current may be suppressed.

Accordingly, MOS transistors according to the present invention may include an amorphous impurity layer that acts as a seed layer for subsequent formation for an amorphous silicon layer. The amorphous silicon layer can be patterned reliably to form a gate electrode. The amorphous silicon layer and the amorphous impurity layer are converted into a polysilicon layer having a buried doped layer during a thermal treatment. Since an underlying polysilicon layer already is present, stresses may be reduced and increases in leakage current may be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of fabricating a gate of an integrated circuit field effect transistor, comprising the steps of:

forming a gate insulating layer on an integrated circuit substrate;

forming a polysilicon layer on the gate insulating layer opposite the integrated circuit substrate;

forming an amorphous impurity layer on the polysilicon layer opposite the gate insulating layer;

forming an amorphous silicon layer on the amorphous impurity layer opposite the polysilicon layer; and thermally treating the amorphous silicon layer, the amorphous impurity layer and the polysilicon layer to convert the polysilicon layer, the amorphous impurity layer and the amorphous silicon layer into a polysilicon gate electrode having a first surface adjacent the gate insulating layer, a second surface opposite the gate insulating layer and a buried doped layer within the polysilicon gate electrode that is spaced apart from the first and second surfaces thereof.

2. A method according to claim 1 wherein the step of forming an amorphous impurity layer on the polysilicon layer opposite the gate insulating layer comprises the step of plasma processing the polysilicon layer opposite the gate insulating layer to amorphize the polysilicon layer opposite the gate insulating layer.

3. A method according to claim 1 wherein the step of forming an amorphous impurity layer on the polysilicon layer opposite the gate insulating layer comprises the step of implanting ions into the polysilicon layer opposite the gate insulating layer to amorphize the polysilicon layer opposite the gate insulating layer.

4. A method according to claim 1 wherein the polysilicon gate electrode has a doping concentration of at least one dopant that decreases from the buried doped layer towards the first surface and towards the second surface.

5. A method according to claim 1 wherein the buried doped layer has doping concentration of at least one dopant that is higher than at the first and second surfaces of the polysilicon gate electrode.

6. A method according to claim 2 wherein the step of plasma processing comprises the step of plasma processing the polysilicon layer opposite the gate insulating layer using at least one of argon, xenon, helium, and krypton.

7. A method according to claim 3 wherein the step of implanting ions comprises the step of implanting at least one of silicon, germanium, indium, arsenic and antimony into the polysilicon layer opposite the gate insulating layer.

8. A method according to claim 1 wherein the thermally treating step is preceded by the step of:

patterning the amorphous silicon layer, the amorphous impurity layer and the polysilicon layer to define a gate electrode pattern.

9. A method of fabricating a gate of an integrated circuit field effect transistor comprising the steps of:

forming a gate insulating layer on an integrated circuit substrate;

forming a polysilicon layer on the gate insulating layer opposite the integrated circuit substrate;

forming an amorphous impurity layer on the polysilicon layer opposite the gate insulating layer;

forming an amorphous silicon layer on the amorphous impurity layer opposite the polysilicon layer; and converting the polysilicon layer, the amorphous impurity layer and the amorphous silicon layer into a polysilicon gate electrode having a first surface adjacent the gate insulating layer, a second surface opposite the gate insulating layer and a buried doped layer within the polysilicon gate electrode that is spaced apart from the first and second surfaces thereof.

10. A method according to claim 9 wherein the step of forming an amorphous impurity layer on the polysilicon layer opposite the gate insulating layer comprises the step of plasma processing the polysilicon layer opposite the gate insulating layer to amorphize the polysilicon layer opposite the gate insulating layer.

11. A method according to claim 9 wherein the step of forming an amorphous impurity layer on the polysilicon layer opposite the gate insulating layer comprises the step of implanting ions into the polysilicon layer opposite the gate insulating layer to amorphize the polysilicon layer opposite the gate insulating layer.

12. A method according to claim 9 wherein the polysilicon gate electrode has a doping concentration that decreases from the buried doped layer towards the first surface and towards the second surface.

13. A method according to claim 9 wherein the buried doped layer has doping concentration that is higher than at the first and second surfaces of the polysilicon gate electrode.

14. A method according to claim 9 wherein the converting step is preceded by the step of:

patterning the amorphous silicon layer, the amorphous impurity layer and the polysilicon layer to define a gate electrode pattern.

15. A method of fabricating an integrated circuit conductor, comprising the steps of:

forming an insulating layer on an integrated circuit substrate;

forming a polysilicon layer on the insulating layer opposite the integrated circuit substrate;

forming an amorphous impurity layer on the polysilicon layer opposite the insulating layer;

forming an amorphous silicon layer on the amorphous impurity layer opposite the polysilicon layer; and thermally treating amorphous silicon layer, the amorphous impurity layer and the polysilicon layer to convert the polysilicon layer, the amorphous impurity layer and the amorphous silicon layer into a polysilicon conductor having a first surface adjacent the insulating layer, a second surface opposite the insulating layer and a buried doped layer within the polysilicon conductor that is spaced apart from the first and second surfaces thereof.

16. A method according to claim 15 wherein the step of forming an amorphous impurity layer on the polysilicon layer opposite the insulating layer comprises the step of plasma processing the polysilicon layer opposite the insulating layer to amorphize the polysilicon layer opposite the insulating layer.

17. A method according to claim 15 wherein the step of forming an amorphous impurity layer on the polysilicon layer opposite the insulating layer comprises the step of implanting ions into the polysilicon layer opposite the insulating layer to amorphize the polysilicon layer opposite the insulating layer.

* * * * *